US006771845B2

(12) United States Patent
Levy et al.

(10) Patent No.: US 6,771,845 B2
(45) Date of Patent: Aug. 3, 2004

(54) OPEN AIR OPTICAL CHANNEL

(75) Inventors: Paul S. Levy, Chandler, AZ (US); Karl H. Mauritz, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 456 days.

(21) Appl. No.: 09/822,970

(22) Filed: Mar. 29, 2001

(65) Prior Publication Data

US 2002/0149825 A1 Oct. 17, 2002

(51) Int. Cl.[7] .............................. G02B 6/12; G02B 6/36; H04B 10/08; H04B 10/00
(52) U.S. Cl. .................... 385/14; 398/1; 398/2; 398/5; 385/53
(58) Field of Search ........................... 385/14, 53, 88, 385/92; 359/118, 130, 140, 164; 439/577; 398/1, 2, 5

(56) References Cited

U.S. PATENT DOCUMENTS

| | | | | |
|---|---|---|---|---|
| 4,850,044 A | * | 7/1989 | Block et al. | 398/118 |
| 5,204,866 A | * | 4/1993 | Block et al. | 372/27 |
| 5,548,772 A | * | 8/1996 | Lin et al. | 359/11 |
| 6,038,355 A | * | 3/2000 | Bishop | 385/14 |

* cited by examiner

Primary Examiner—Hemang Sanghavi
Assistant Examiner—Omar Rojas
(74) Attorney, Agent, or Firm—Blakely, Sokoloff, Taylor & Zafman LLP

(57) ABSTRACT

Various embodiments of apparatus and various embodiments of methods to communicate between a first circuit board and a second circuit board using one or more open air communication channels are provided. A plurality of light transmitters and light receivers are attached to a first circuit board; and a corresponding plurality of light receivers and light transmitters are attached to a second circuit board. The light receivers on both circuit boards are disposed to receive data transmitted by the corresponding light transmitters on each circuit board. In one embodiment, where the light transmitters are laser diodes, different colors may be used to increase adjacent signal rejection. In another embodiment, the light transmitters may be laser, radio, microwave, digital, ultraviolet, or infrared light transmitters. The light transmitters may transmit data across open spaces between circuit boards, including through apertures in boards placed between the light transmitter and light receiver.

15 Claims, 6 Drawing Sheets

OPEN AIR OPTICAL CHANNEL

FIELD OF THE INVENTION

The field of the invention relates to circuit boards generally, and more particularly, to apparatus and methods for communicating data over an open space between circuit boards.

BACKGROUND OF THE INVENTION

Computers and other electrical devices operate using printed circuit boards (PCB's), thin substrates on which chips or other electronic components are mounted. In the context of personal computers (PC's), some circuit boards, called backplanes, contain sockets for expansion cards, special circuit boards that, when inserted into the backplane, add new capabilities to the computer.

Backplanes are often described as active or passive. Active backplanes contain logical circuitry that performs computing functions. On the other hand, passive backplanes contain almost no computing circuitry. Most backplanes used in personal computers are active, but there has been a recent move toward passive backplanes.

In a passive backplane system, active components such as the CPU are inserted on an additional card, making it easier to upgrade and to repair faulty components. Whether a backplane is active or passive, a PCB inserted into an expansion slot can communicate with another PCB inserted in the backplane via the PCB's edge connector, a tabbed edge of the PCB containing a plurality of parallel traces. When inserted into an expansion slot, the traces on the edge connector connect with a corresponding plurality of traces inside the expansion slot. These internal traces connect through the backplane to other expansion slots and to other components on the backplane itself. In this manner, the backplane's internal bus architecture can be used to communicate data from one PCB to another PCB located further down the backplane.

Though effective, the internal bus approach is problematic. First, the large number of required traces and connectors quickly consumes available board space. Second, though the rate of data transfer is theoretically only limited by the clock speed of the bus, bottlenecks often cripple the rate of data transfer and impair communication between circuit boards. Third, inserting or removing a circuit board during operation of the computer or electronic device is almost unthinkable. At the very least, doing so may cause a minor data loss. At worst, a system crash may result. Consequently, it is difficult to diagnose, repair, and/or replace faulty expansion cards without first shutting down the entire system. Fourth, communication channels are only established when the expansion cards are properly seated within the expansion slots. Fifth, signal quality may be at risk if specific engineering guide lines are not followed such stripline or Micro-Strip. Gaps in data transmission may occur if the card is removed or is not properly seated.

FIG. 1 illustrates a common circuit board 100, which consists of chips 102, traces 103 and other components (104, 105) attached to a single or multi-layer substrate. Traces 103 terminate at edge connector 106, which is the part of the circuit board that is inserted into an expansion slot in a backplane. Though most expansion cards use copper traces, there has been a recent move towards replacing the copper traces with a single optical fiber. Wave division multiplexing gives a single optical fiber tremendous bandwidth, but optical fiber suffers from the same problems affecting copper traces. For example, PCB's using optical fiber must be properly seated within an expansion slot to work properly, and should not be inserted or removed without first shutting down the entire system.

Today's high availability systems operate continuously around the clock. Consequently, new developments in fault-tolerant technology are required. Such developments should virtually eliminate the need to physically connect PCB's with copper traces or optical fiber, and should enable expansion cards to be removed or added to a system's backplane without disrupting system operation.

As will be evident from the figures and accompanying written descriptions, the open air communication channel embodied by the present invention supplies solutions to these and other needs long felt in the art.

BRIEF DESCRIPTION OF THE DRAWINGS

The present invention is illustrated by way of example and not limitation in the figures of the accompanying drawings, in which

FIG. 5b illustrates a sectional end view of the stack of circuit boards shown in FIG. 5a.

DETAILED DESCRIPTION OF THE PREFERRED EMBODIMENT

Various embodiments of apparatus and various embodiments of methods to communicate between a first circuit board and a second circuit board using one or more open air communications channels are disclosed. In the following detailed description, numerous specific details are set forth in order to provide a thorough understanding of the present invention. However, it will be apparent to one of ordinary skill in the art that these specific details need not be used to practice the present invention. In other circumstances, well-known structures, materials, or processes have not been shown or described in detail in order not to unnecessarily obscure the present invention.

Figure 1:
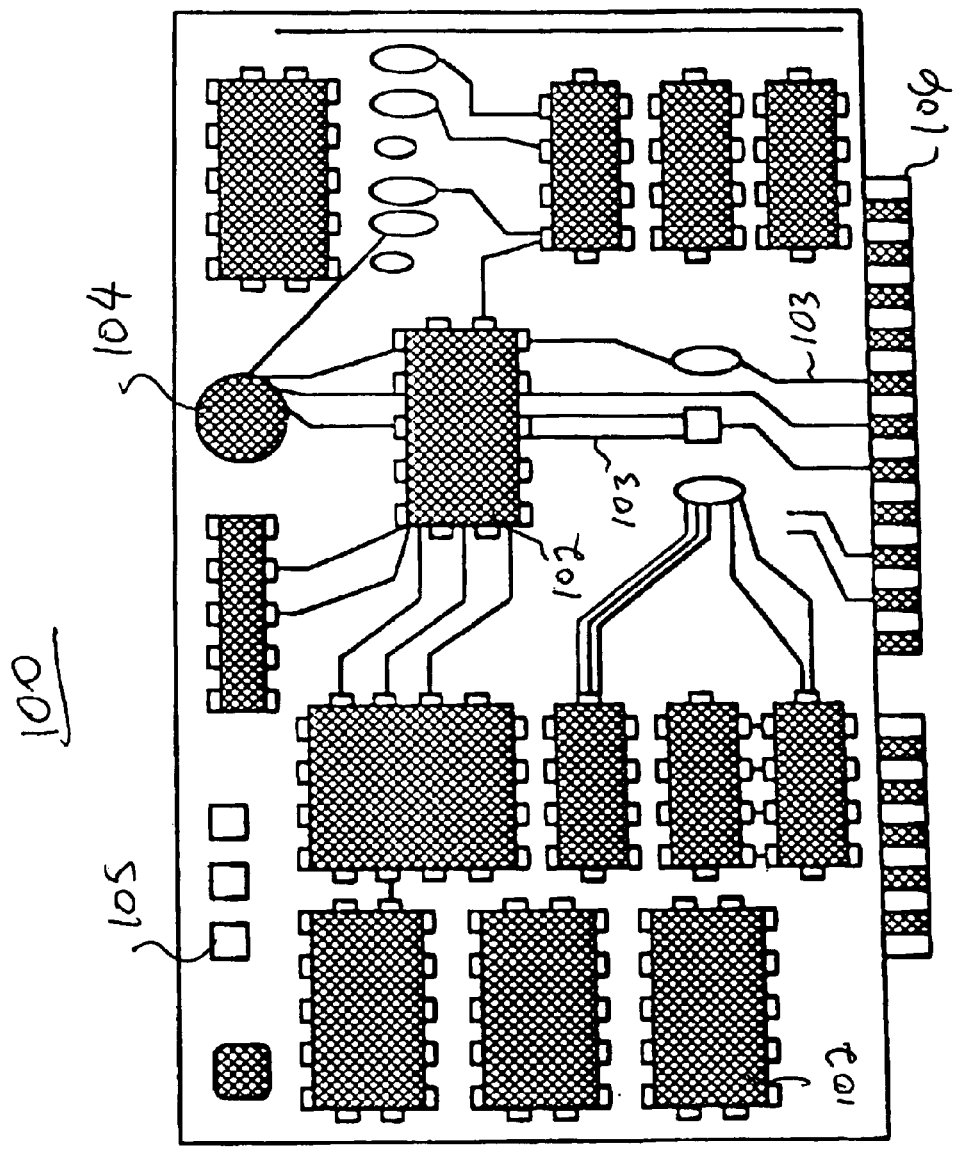
FIG. 1 illustrates a prior art circuit board.
Figure 2:
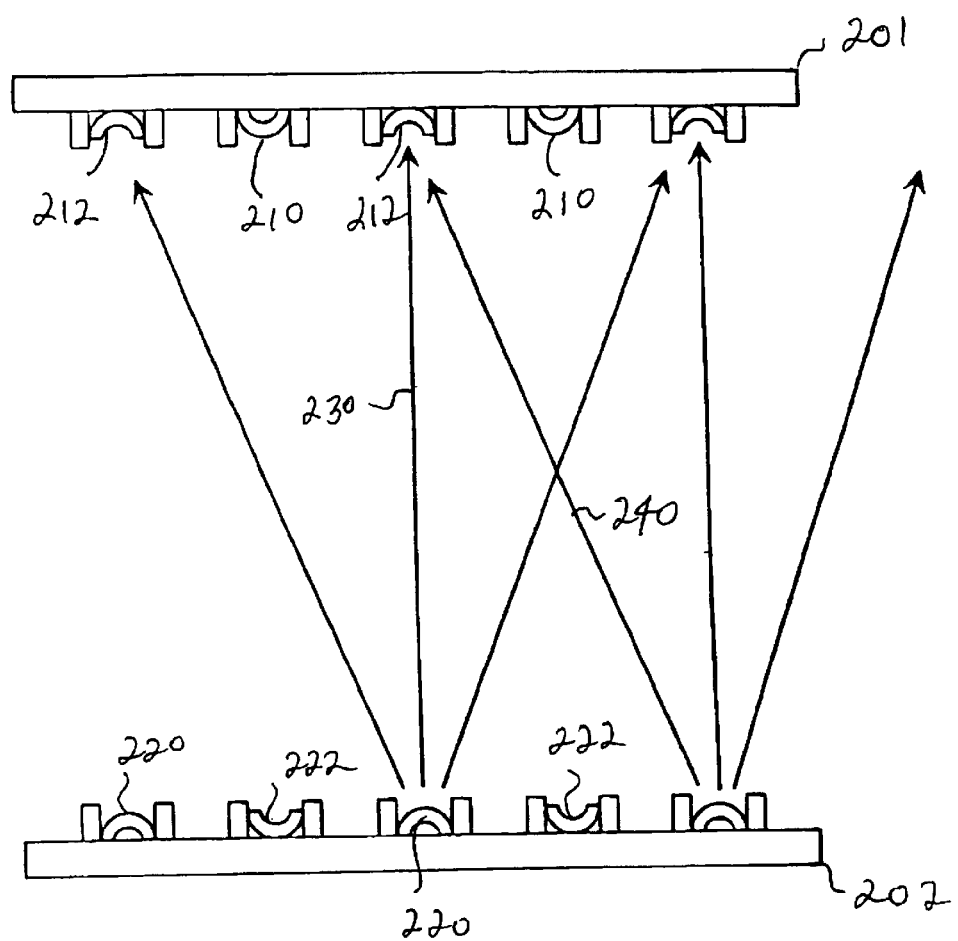
FIG. 2 illustrates two circuit boards having multiple open air communications channels between them according to one embodiment of the invention.

Referring now to FIG. 2, two circuit boards (201, 202) are shown, according to one embodiment of the invention, having multiple open air communications channels (230, 240) between them. Each circuit board (201, 202) includes one or more light transmitters (210, 220) and one or more corresponding light receivers (212, 222). In one embodiment, light receivers 212 and 222 are uniquely tuned to the transmitting frequencies of corresponding light transmitters 210 and 220. As used herein, the term "light" includes visible and invisible light. For example, a light transmitter may transmit data signals using visible or invisible light.

In one embodiment, Vertical Cavity Surface Emitting Lasers (VCSELs) are used as light transmitters (210, 220). Because it is desirable to improve the signal integrity of each communication channel (230, 240) by maximizing each channel's signal-to-noise ratio (SNR), the placement of the VCSELs needs to have proper spacing so that the same color VCSEL does not interfere with an unintended neighboring light receiver of the same frequency color. Additionally, an appropriate calumniating lens system may be used to attenuate the transmission beam. By picking colors appropriately, wider columns of transmission beams can be used that will ease communication and alignment with targeted light receivers. In another embodiment, controlled doping on VCSEL arrays may be used to ease constriction of light channel matrix construction.

Using one or more communication channels between printed circuit boards (PCBs) eliminates the copper traces on the edge connectors, and achieves data transfer rates that exceed the rates achieved by traditional backplane systems now in use. For example, in traditional backplane systems, impedance in the copper traces lowers the SNR of the transmission path, considerably slowing data transfer rates from what is theoretically possible. By sidestepping the copper backplane architecture altogether, embodiments of the present invention minimize or eliminate the copper trace impedance that formerly lowered the SNR of the transmission path. Consequently, the SNR of the transmission path is raised, and data transfer rates are increased.

Figure 3:
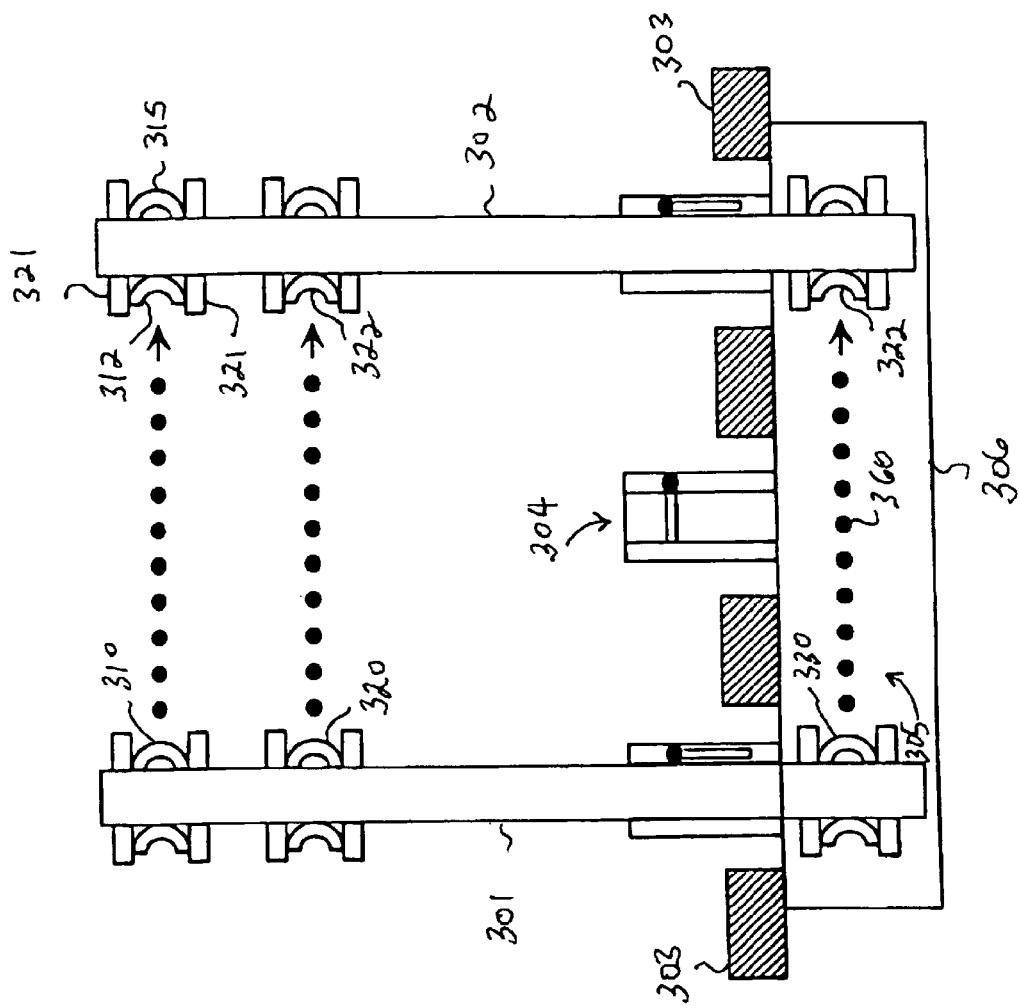
FIG. 3 illustrates two circuit boards inserted into a backplane that have multiple open air communications channels between them according to another embodiment of the invention.

Referring now to FIG. 3, two circuit boards (301, 302) are shown removably inserted into a backplane 306, which may be attached to a chassis 303 as shown. A plurality of light transmitters (310, 320, 330) and a corresponding plurality of light receivers (312, 322, 332) may be coupled with one or both sides of circuit boards (301, 302) in a variety of combinations.

In one embodiment, one or more light transmitters may be attached to only one side of each of circuit boards 301 and 302. In another embodiment, one or more light receivers may be attached to only one side of each of circuit boards 301 and 302. In yet another embodiment, a first side of each of circuit boards 301 and 302 may contain one or more light transmitters, while the other side contains one or more light receivers. In other embodiments, one or both sides of each of circuit boards 301 and 302 may contain one or more light transmitters and light receivers. In any embodiment, the light receivers and light transmitters may be placed anywhere within the X-Y plane of the circuit board to which they are attached, including the planar surface of the circuit board's tabbed edge connector. Additionally, one or more light transmitters and/or light receivers may be positioned within the thickness of an edge or edges of the circuit board substrate. Edge mounting light receivers and/or light transmitters on circuit board 301 or 302 expands the number of communication channels available. For example, whereas a circuit board having light receivers and light transmitters coupled with both of its planar surfaces can communicate only with two other adjacent boards, a circuit board having edge mounted light receivers and light transmitters can communicate with at least four other circuit boards positioned around its four edges.

Light transmitters and/or light receivers may be attached to or coupled with a circuit board using any one of a number of suitable attachment or coupling methods well known in the art, such as, for example, by soldering, by an adhesive, or by a physical connection, such as a bracket. In one embodiment, the light receivers and/or light transmitters may be flush mounted within apertures in the circuit board.

In another embodiment, brackets 321 may be used to attach the light transmitters and/or light receivers to the circuit board.

Optical fiber may be used to link light transmitters and/or light receivers to a circuit board where it is desirable to connect them to various components on the circuit board, such as other light transmitters and/or light receivers. For example, in FIG. 3, an optical fiber (not shown) may be used to link light receiver 312 on one side of circuit board 302 with light transmitter 315 on the other side of circuit board 302. Where it is desirable to increase the bandwidth of the circuit board's internal bus architecture, the copper traces running between the card's components may be supplemented or replaced with optical fibers capable of handling 1,024 or more colors (communication channels).

In one embodiment, the elements needed to construct a communication channel include, but are not limited to: (i) a light transmitter (ii) in communication with a corresponding light receiver (iii) over or through an open space between the light transmitter and its corresponding light receiver. When constructing a communication channel, care should be taken to prevent contaminants such as dust or smoke from filtering through the open spaces between light transmitters and light receivers; otherwise, the integrity and reliability of the communication channel may be compromised.

As shown in FIG. 3, a light channel 305 may be formed within backplane 306 to prevent ambient light and other contaminants from disrupting communication channel 360. In one embodiment, light channel 305 may be an enclosed optical space bounded on at least one side by the structural material of backplane 306 (and/or expansion slot 304). In another embodiment, multiple communication channels may be formed within light channel 305.

It may be desirable to reduce or eliminate cross-over interference in embodiments where light receivers are placed adjacent each other or in close proximity to each other. Transmission beams tend to expand radially outward over distance. In some embodiments, such expansion may cause a transmission beam to overlap light receivers adjacent or in close proximity to the target light receiver, resulting in interference with signals in other communication channels. In one embodiment, cross-over interference can be reduced or substantially eliminated by assigning each light transmitter and corresponding light receiver a particular color or broadcast frequency. For example, light transmitter 310 in FIG. 3 may be a blue laser, while light transmitter 320 may be a red laser. Such an embodiment reduces cross-over interference and increases adjacent signal rejection because light receiver 322, being tuned to receive red laser light, will reject any blue laser light that happens to overlap it. Other methods of increasing adjacent signal rejection include, but are not limited to: increasing the spacing between light receivers, attenuating the transmission beam using appropriate lenses and/or doping methods, and placing different color (frequency) light receivers between light receivers of the same color (frequency).

Figure 4:
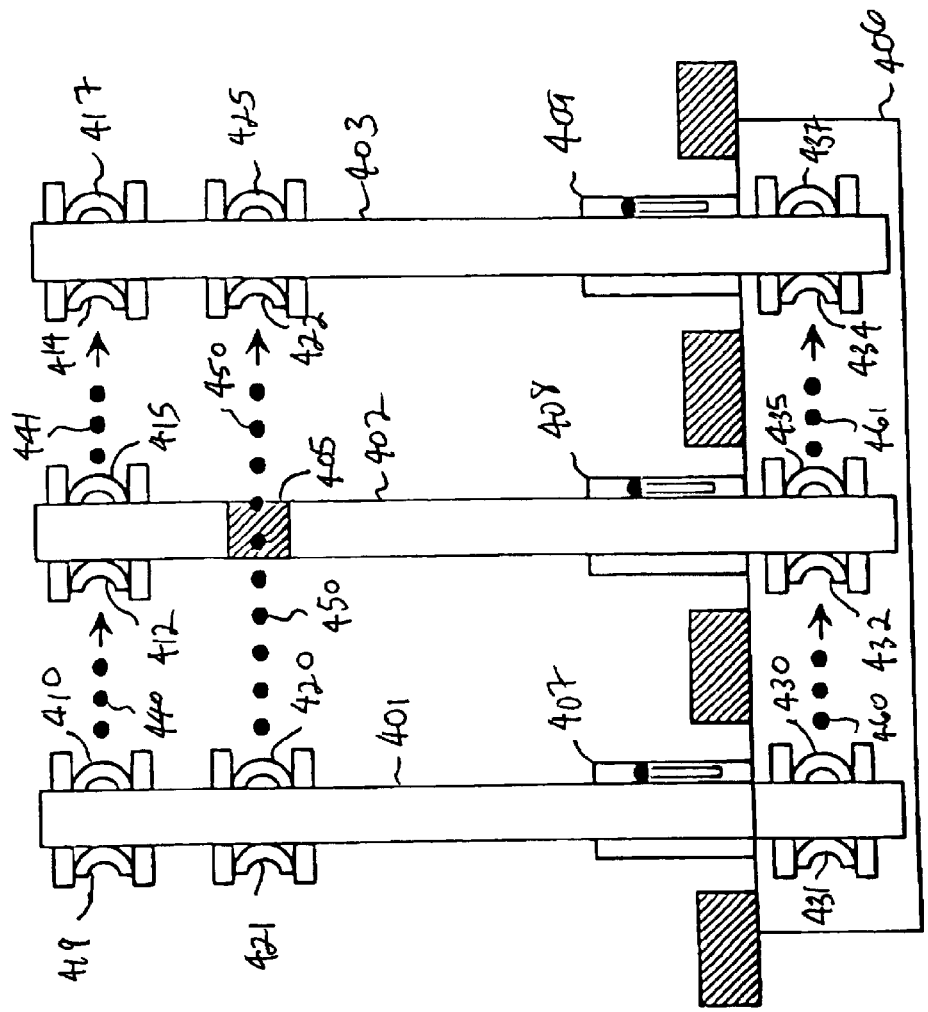
FIG. 4 illustrates a fault tolerant backplane according to another embodiment of the invention.

Referring now to FIG. 4, a fault tolerant backplane 406 is shown according to another embodiment of the invention. Backplane 406 includes three expansion slots (407, 408, 409) into which three circuit boards (401, 402, 403) are respectively removably inserted. Circuit boards 401 and 403 are virtually identical in appearance, with circuit board 401 having light transmitters 410, 420, 430 attached to its upper surface and light receivers 419, 421, 431 attached to its lower surface, and circuit board 403 having light transmitters 417, 425, 437 attached to its upper surface and light receivers 414, 422, 434 attached to its lower surface. Circuit board 402 is positioned between boards 401 and 403. Light transmitters 415 and 435 are attached to is upper surface, and light receivers 412, 432 are attached to its lower surface. Circuit board 402 contains an aperture 405, which enables board 401 to "see" board 403.

Communication channel 440 is formed between light transmitter 410 on board 401 and corresponding light receiver 412 on board 402. Communication channel 441 is formed between light transmitter 415 on board 402 and light receiver 414 on board 403. Communication channel 450 is formed between light transmitter 420 on board 301 and corresponding light receiver 422 on board 403 via aperture 405 in board 402 that allows transmission beam 450 to pass unimpeded through circuit board 402. The last two communications channels 460 and 461 are formed within the structure of backplane 406 and may be used to power or ground circuit boards (401, 402, 403). Channel 460 is formed between light transmitter 430 on board 401 and light receiver 432 on board 402. Channel 461 is formed between light transmitter 435 on board 402 and light receiver 434 on board 403.

Backplane 406 in FIG. 4 is fault-tolerant and self-healing. For example, if board 402 is removed from backplane 406, communication between light transmitter 410 and light receiver 414, between light transmitter 420 and light receiver 422, and between light transmitter 430 and light receiver 434 will be automatically reestablished at various times as board 402 is removed. For example, channels 460 and 461 will be the first to merge, followed by a brief merger of channels 440 and 441 as aperture 405 passes between light transmitter 410 and light receiver 414, followed by the reacquisition of channel 450, followed by a final merging of channels 440 and 441.

Each board can be programmed to automatically retry establishing an operable communication channel whenever a change in signal generation is detected. Alternatively, each board can be programmed to automatically reroute data traffic from an inoperable communication channel to an operable one whenever an absence of data signal (in one embodiment, light) is detected.

Contrast the self healing aspect of the present invention with the non-self-healing aspect of circuit boards using copper traces or optical fiber. In these types of boards, removal of the copper trace or optical fiber kills the channel, which remains dead as the faulty circuit board is removed, a new one inserted, the traces or optical fiber reconnected, and the system is reinitialized.

In one embodiment, boards 401, 402, 403 may each have the same or different functionalities. Similarly, expansion slots 407, 408, 409 may each have the same or different functionalities. For example, expansion slot 408 may have a specific signal the other expansion slots do not. In one embodiment, a board's functionality is "slot independent", meaning that the functionality resides entirely within the board. In another embodiment, each card's functionality is determined by the expansion slot in which it is removably inserted (slot dependent functionality). In one slot dependent embodiment having eight expansion slots, two may be used as controllers, and the remaining six divided as needed between input/output and storage functions (e.g. four input/output and two storage).

Figure 5A:
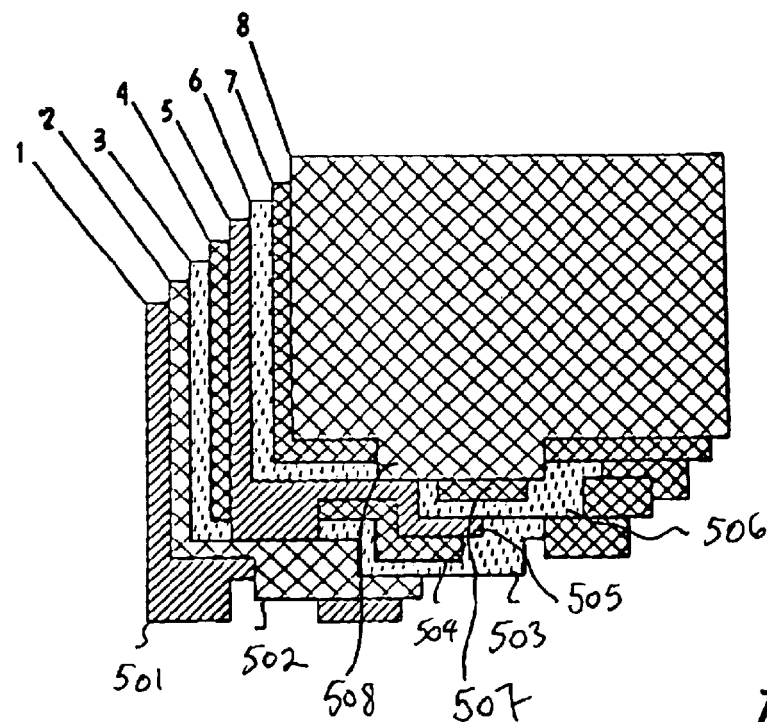
FIG. 5a illustrates a stack of eight circuit boards according to another embodiment of the invention.
Figure 5B:
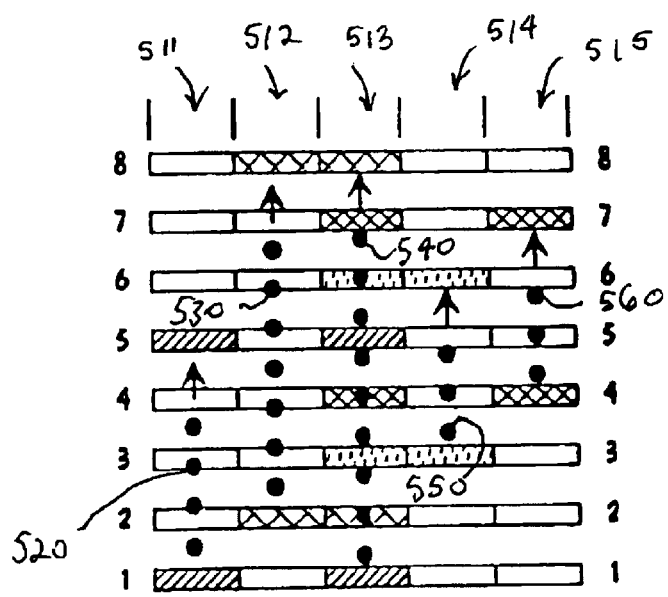

Referring now to FIGS. 5*a* and 5*b*, FIG. 5*a* shows a perspective view of a stack of eight circuit boards according to one aspect of the invention. FIG. 5*b* illustrates a sectional end view of the stack of eight circuit boards shown in FIG. 5*a*.

In FIG. 5*a*, a stack of eight circuit boards is shown. The boards are consecutively numbered 1–8, with board 1 on the bottom of the stack, and board 8 on the top. One edge of each board includes one or more tabs that may be inserted into the expansion slot(s) of a backplane. The tabs are consecutively numbered 501–508 to correspond with the appropriate board. For example, board 1 includes tabs 501; board 2 includes tabs 502, board 3 includes tabs 503, and so on.

The tabs on each board occupy one or more of five columnar positions. In FIG. 5*b*, the columnar positions are represented by columns 511, 512, 513, 514, and 515, which are numbered consecutively from left to right. The tabs are represented in FIG. 5*b* as shaded rectangles. Each rectangle representing a tab is shaded the same as the board to which it is attached. For example, tabs 501 in FIG. 5*a* are represented in FIG. 5*b* as diagonally shaded rectangles because board 1 in FIG. 5*a* is diagonally shaded. Additionally, the stack of boards in FIG. 5*b* is numbered consecutively 1–8 on both sides, beginning with board 1 on the bottom and ending with board 8 on the top.

Careful arrangement of tabs 501–508 enables various pairs of boards located on different levels of the stack to communicate with each other. For example, tabs 501 and 505 occupy both columnar position 511 and columnar position 513. The absence of tabs in column 511 on boards 2, 3, and 4 allows a light transmitter (not shown) attached to the top side of tab 501 to communicate with a corresponding light transmitter (not shown) attached to the bottom side of tab 505. In this manner, communication channel 520 may be established in columnar position 511 between boards 1 and 5. Similarly, board 2 may communicate directly with board 8 using communication channel 530 in columnar position 512; board 3 may communicate directly with board 6 using communication channel 550 in columnar position 514; and board 4 may communicate directly with board 7 using communication channel 560 in columnar position 515. Communication channel 540, in columnar position 513 may be used to relay a power signal from board to board.

Communication channel 540 is fault tolerant and self-healing in that removal of an interior board simply connects the relayed supervisory signal to the next available board. For example, if board 3 were removed, the supervisory signal from board 2 would be automatically relayed to board 4. In one embodiment, the supervisory signal enables the system to recognize the presence or absence of a board.

The other communication channels are also self-healing in that removal of an interior board will not disrupt communications. For example, board 3 may be removed without disrupting communication channels 520 or 530 because board 3 has no tabs in columnar positions 511 or 512. However, removal of board 3 would disrupt communication channel 550 because tab 503 occupies columnar position 514 and may carry a light transmitter and/or light receiver.

Each of boards 1–8 may be equipped with notification circuitry designed to (i) detect a change in transmission intensity (e.g. such as that caused by the removal or fault of a light transmitter and/or light receiver), to (ii) automatically shutdown the affected communication channel, and (iii) to automatically reroute data traffic to another operable channel, and/or (iv) to automatically retry to establish communications in the affected channel(s).

Figure 6:
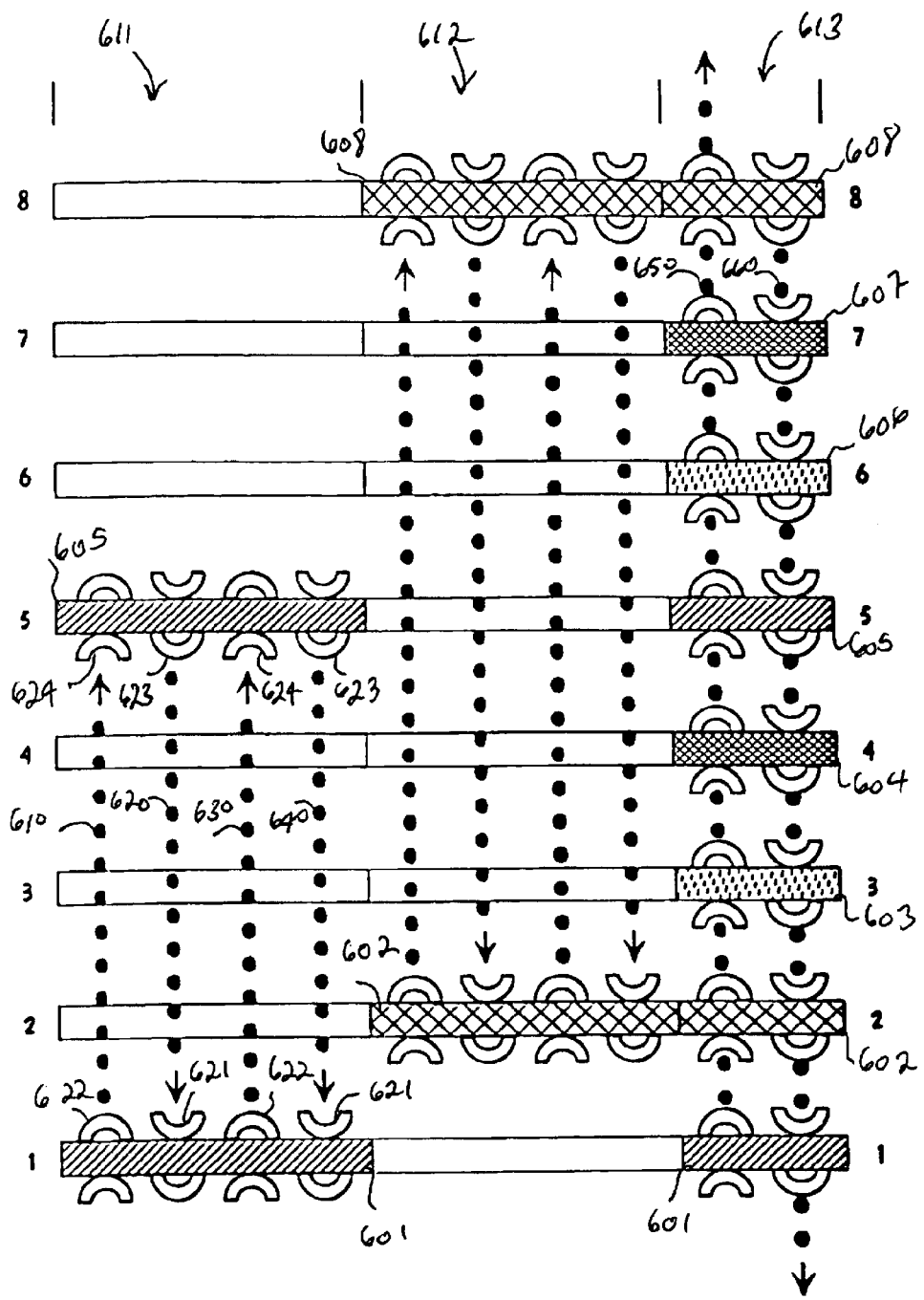
FIG. 6 illustrates a sectional view of a stack of circuit boards having multiple open air communications channels between them according to another embodiment of the invention.

Referring now to FIG. 6, a sectional end view of a stack of eight tabbed circuit boards is shown according to another embodiment of the invention. The boards in the stack are consecutively numbered 1–8, beginning with board 1 on the bottom, and ending with board 8 on the top. In this embodiment, one edge of each circuit board has one or more tabs that may be inserted within the expansion slots of a backplane (not shown). The tabs are consecutively numbered 601–608 to correspond to the circuit board to which they are attached. For example, tab 601 is attached to board 1; tab 602 to board 2; tab 603 to board 3, and so on.

The tabbed portions of each circuit board may occupy one or more of three columnar positions 611, 612, 613. In FIG. 6, these tabbed portions are represented by shaded rectangular blocks. For example, tabs 608 are represented by blocks filled with cross-hatched shading; tab 607 is represented by a block filled with uniform grey shading, and so on.

In FIG. 6, tabs 601–608 are arranged within columns 601, 602, 603 to allow communications between pairs of boards located on different levels within the stack. For example, light transmitters 622 on the top surface of tab 601 can communicate with light receivers 624 on the bottom surface of tab 605. Similarly, light transmitters 623 on the bottom surface of tab 605 can communicate with light receivers 621 on the top surface of tab 601.

In this manner, a plurality of communication channels 610, 620, 630, 640, may be established between tabs 601 and 605. Similar pluralities of communication channels may be formed between tabs in columns 612 and 613. The two communication channels 650 and 660 formed in column 613 may be used to relay a power signal from board to board. Additionally, the communication channels shown in FIG. 6 are fault-tolerant and self-healing in the same way as the channels illustratively described with reference to FIG. 5b.

Thus, apparatus and methods to communicate between a first circuit board and a second circuit board using one or more open air communications channels are disclosed. Although the present invention is described herein with reference to a specific preferred embodiment, many modifications and variations therein will readily occur to those with ordinary skill in the art. Accordingly, all such variations and modifications are included within the intended scope of the present invention as defined by the following claims.

What is claimed is:

1. A fault-tolerant system, comprising:
   a first circuit board removably inserted within a first receptor of a backplane, the first circuit board having a first, second, and third light receivers affixed to its bottom surface;
   a second circuit board removably inserted within a second receptor of the backplane, the second circuit board having a first and second light transmitters affixed to its top surface, the second circuit board having an aperture therein, and having a fourth and fifth light receivers affixed to its bottom surface; and
   a third circuit board removably inserted within a third receptor of the backplane, the third circuit board having a third, fourth, and fifth light transmitters affixed to its top surface,
   wherein a detected change in transmission intensity of a faulted data signal automatically initiates an orderly shutdown and rerouting of the faulted data signal.

2. The fault-tolerant system of claim 1, further comprising:
   a first optical channel defined between the first light receiver and the first light transmitter.

3. The fault-tolerant system of claim 1, further comprising:
   a second optical channel defined between the third light receiver and the second light transmitter.

4. The fault-tolerant system of claim 1, further comprising:
   a third optical channel defined between the second light receiver and the fourth light transmitter, wherein a data signal carried by the third optical channel passes through the aperture in the second circuit board.

5. The fault-tolerant system of claim 1, further comprising:
   a fourth optical channel defined between the fourth light receiver and the third light transmitter.

6. The fault-tolerant system of claim 1, further comprising:
   a fifth optical channel defined between the fifth light receiver and the fifth light transmitter.

7. The fault-tolerant system of claim 1 wherein the change in transmission intensity results from an insertion or removal of a circuit board from the stack of circuit boards.

8. The fault-tolerant system of claim 1 wherein removal of the second circuit board from the stack of circuit boards during operation of an optical channel automatically provides an alternate optical channel.

9. The fault-tolerant system of claim 1 wherein no physical connection between circuit boards is needed to transmit and receive a data signal through the air between two or more boards.

10. A method, comprising:
    providing a plurality of circuit boards, each board having at least a light transmitter affixed to its top surface and at least a light receiver affixed to its bottom surface, at least one board having an aperture therein;
    removably inserting the plurality of circuit boards into a corresponding plurality of receptors in a backplane, wherein the circuit board having an aperture therein is positioned between a first circuit board and a second circuit board, such that a data signal transmitted through the air from a light transmitter on either the first or second circuit board can pass through the aperture; and
    designating a redundant circuit board to operate in a shadow mode until a change in transmission intensity is detected in an optical channel.

11. The method of claim 10, further comprising:
    establishing at least one optical channel between the plurality of boards, the optical channel being defined by a light transmitter on one board transmitting a data signal through the air to a corresponding light receiver on another board.

12. The method of claim 10, further comprising:
    arranging the plurality of circuit boards into a first group and a second group, wherein a placement of circuit boards in the first group forms a pattern, and wherein a placement of circuit boards in the second group forms a mirror image of the pattern.

13. The method of claim 10, further comprising:
    transmitting a first frequency color from a first light transmitter; and
    transmitting a second frequency color from a second light transmitter.

14. A fault-tolerant system, comprising:
    a first circuit board removably inserted within a first receptor of a backplane, the first circuit board having a first plurality of light receivers affixed to its bottom surface;
    a second circuit board removably inserted within a second receptor of the backplane, the second circuit board having a first plurality of light transmitters affixed to its top surface, the second circuit board having an aperture therein, and having a second plurality of light receivers affixed to its bottom surface; and a third circuit board removably inserted within a third receptor of the backplane, the third circuit board having a second plurality of light transmitters affixed to its top surface, wherein a spare backplane receptor contains a backup circuit board that can be operated in a shadow mode until ordered to carry data traffic rerouted from a faulted optical channel.

15. A method, comprising:

providing a plurality of circuit boards, each board having at least a light transmitter affixed to its top surface and at least a light receiver affixed to its bottom surface, at least one board having an aperture therein;

removably inserting the plurality of circuit boards into a corresponding plurality of receptors in a backplane, wherein the circuit board having an aperture therein is positioned between a first circuit board and a second circuit board, such that a data signal transmitted through the air from a light transmitter on either the first or second circuit board can pass through the aperture;

detecting a change in transmission intensity in the optical channel that occurs when a circuit board is inserted or removed;

automatically rerouting a data signal from the faulted optical channel through a redundant circuit board; and automatically managing an orderly shutdown of the faulted optical channel.

\* \* \* \* \*